(12) United States Patent
Pickerd et al.

(10) Patent No.: US 12,085,590 B2
(45) Date of Patent: Sep. 10, 2024

(54) SWEPT PARAMETER OSCILLOSCOPE

(71) Applicant: Tektronix, Inc., Beaverton, OR (US)

(72) Inventors: John J. Pickerd, Hillsboro, OR (US);
Justin E. Patterson, Honolulu, HI (US)

(73) Assignee: Tektronix, Inc., Beaverton, OR (US)

( * ) Notice: Subject to any disclaimer, the term of this patent is extended or adjusted under 35 U.S.C. 154(b) by 240 days.

(21) Appl. No.: 17/862,293

(22) Filed: Jul. 11, 2022

(65) Prior Publication Data

US 2023/0019734 A1 Jan. 19, 2023

Related U.S. Application Data

(60) Provisional application No. 63/221,711, filed on Jul. 14, 2021.

(51) Int. Cl.
| | |
|---|---|
| *G01R 13/02* | (2006.01) |
| *G06T 13/00* | (2011.01) |
| *G06F 3/0482* | (2013.01) |
| *G06F 3/04847* | (2022.01) |

(52) U.S. Cl.
CPC ..... *G01R 13/0218* (2013.01); *G01R 13/0254* (2013.01); *G01R 13/029* (2013.01); *G06T 13/00* (2013.01); *G06F 3/0482* (2013.01); *G06F 3/04847* (2013.01); *G06T 2200/24* (2013.01)

(58) Field of Classification Search
CPC ....................................................... G01R 27/00
See application file for complete search history.

(56) References Cited

U.S. PATENT DOCUMENTS

| | | | | |
|---|---|---|---|---|
| 2004/0164984 A1* | 8/2004 | Pickerd | ................ | G01R 13/029 345/440 |
| 2005/0017707 A1* | 1/2005 | Ramesh | ................ | G01R 31/40 324/102 |
| 2018/0113169 A1* | 4/2018 | Birurakis | ................ | G06F 11/32 |

\* cited by examiner

*Primary Examiner* — Tung X Nguyen
(74) *Attorney, Agent, or Firm* — Miller Nash LLP; Andrew J. Harrington

(57) ABSTRACT

A test and measurement instrument has a user interface configured to allow a user to provide one or more user inputs, a display to display results to the user, a memory, one or more processors configured to execute code to cause the one or more processors to receive a waveform array containing waveforms resulting from sweeping one or more parameters from a set of parameters, recover a clock signal from the waveform array, generate a waveform image for each waveform, render the waveform images into video frames to produce an image array of the video frames, select at least some of the video frames to form a video sequence, and play the video sequence on a display. A method of animating waveform data includes receiving a waveform array containing waveforms resulting from sweeping one or more parameters from a set of parameters, recovering a clock signal from the waveforms, generating a waveform image from each of the waveforms, rendering the waveform images into video frames to produce an image array of the video frames, selecting at least some of the video frames to play as a video sequence, and playing the video sequence on a display.

20 Claims, 6 Drawing Sheets

Initialized Animation | View Animation

Set Up Movie

Meta Data Array
c:/myPath/myFilename.msd  [Browse]

Waveform Array
c:/myPath/myFilename.wfa  [Browse]

Array Size:  N = 7776
Parameters File
c:/myPath/myFilename.swp  [Browse]

Sweep Parameters Range Values

| Name | Tag | Values |
|---|---|---|
| A | Level1 | 0, 2.3, 3.3, 4.3, 5.3 |
| B | Level3 | 0, 2.3, 3.3, 4.3, 5.3 |
| C | Level4 | 0, 2.3, 3.3, 4.3, 5.3 |
| D | Tap1 | 0, .2, .4, .6, .8 |
| E | Tap2 | 0, .1, .2, .3, .4 |
| F | Tap3 | 0, .2, .4, .6, .8 |

Frame Content

☑ Metadata
☑ Eye Diagram
☐ Cyclic Loops
☑ YT UI sequence
☐ Spectrum Mag/Freq
☐ Spectrum XYZ
☐ Bicoherence
☐ Bispectrum phase
☐ Bispectrum Magnitude

Create Movie

[Render All]

Output Movie File name
c:/myPath/myFilename.msd

[Save File]

SWEPT PARAMETER OSCILLOSCOPE

CROSS-REFERENCE TO RELATED APPLICATIONS

This disclosure claims benefit of U.S. Provisional Application No. 63/221,711, titled "SWEPT PARAMETER OSCILLOSCOPE," filed on Jul. 14, 2021, the disclosure of which is incorporated herein by reference in its entirety.

TECHNICAL FIELD

This disclosure relates to test and measurement instruments, and more particularly to a swept parameter oscilloscope.

DESCRIPTION

The use of machine learning to analyze and make predictions has many advantages, including how quickly the machine learning system can refine predictions and provide those predictions to the users. For manufacturing, the predictions become parameter settings or used in high-volume testing of electronic components. Training a machine learning system may involve thousands of long record waveforms that have one or more measurement parameters, or some other associated parameter, swept.

Machine learning associated with waveforms and metadata results in the issue of how to view and understand the data. This problem occurs for example, with optical transmitter tuning, where perhaps five tuning parameters are swept over some standard optimal range of settings and a waveform is acquired for each parameter set. If each parameter only has five settings, sweeping each parameter would result in generation of $5^5=3125$ waveforms. It is very awkward and cumbersome to try to analyze these data sets to make judgements for what parameter sweep ranges are valid on the manufacturing line and to make conclusions on how one parameter affects another. An easy and fast way to view all of the thousands of waveforms and observe the parameter sweep interactions and effects would alleviate this problem.

BRIEF DESCRIPTION OF THE DRAWINGS

FIG. 5 shows an embodiment of a user interface to initiate animation.

DETAILED DESCRIPTION

Machine learning is often applied towards circuit or system optimization problems. This occurs where there are some set of parameters or variables that must be tuned to obtain a desired optimal performance from the system. One example is an optical transmitter or transceiver used in data center links. It may have five or more adjustable parameters that must be tuned during the manufacturing process. Typically, they are tuned to obtain an optimal Pulse Amplitude Modulation 4-level (PAM4) eye diagram response with maximum eye opening for all the levels. However, given five parameters that each could have five possible values, that results in $5^5=3125$ waveforms that would need to be acquired to represent every combination of parameter setting.

Currently tools do not exist that allow a user to look at this large number of waveforms and easily evaluate the effects of each of the swept parameters. The terms "sweeping" and "swept parameter" refer to changing a parameter in increments while other parameters in the parameter set remain at constant values.

The embodiments here, referred to as a Swept Parameter Oscilloscope, or SPO, provide such a tool having interactive animation controls. This allows the user to create animations including frames where only one parameter has been swept with the other parameters remain constant. The embodiments also include building an animation that includes all waveforms with all tuning parameters swept settings included. Current oscilloscope technology cannot support and display this type of interaction with the user.

Figure 1:
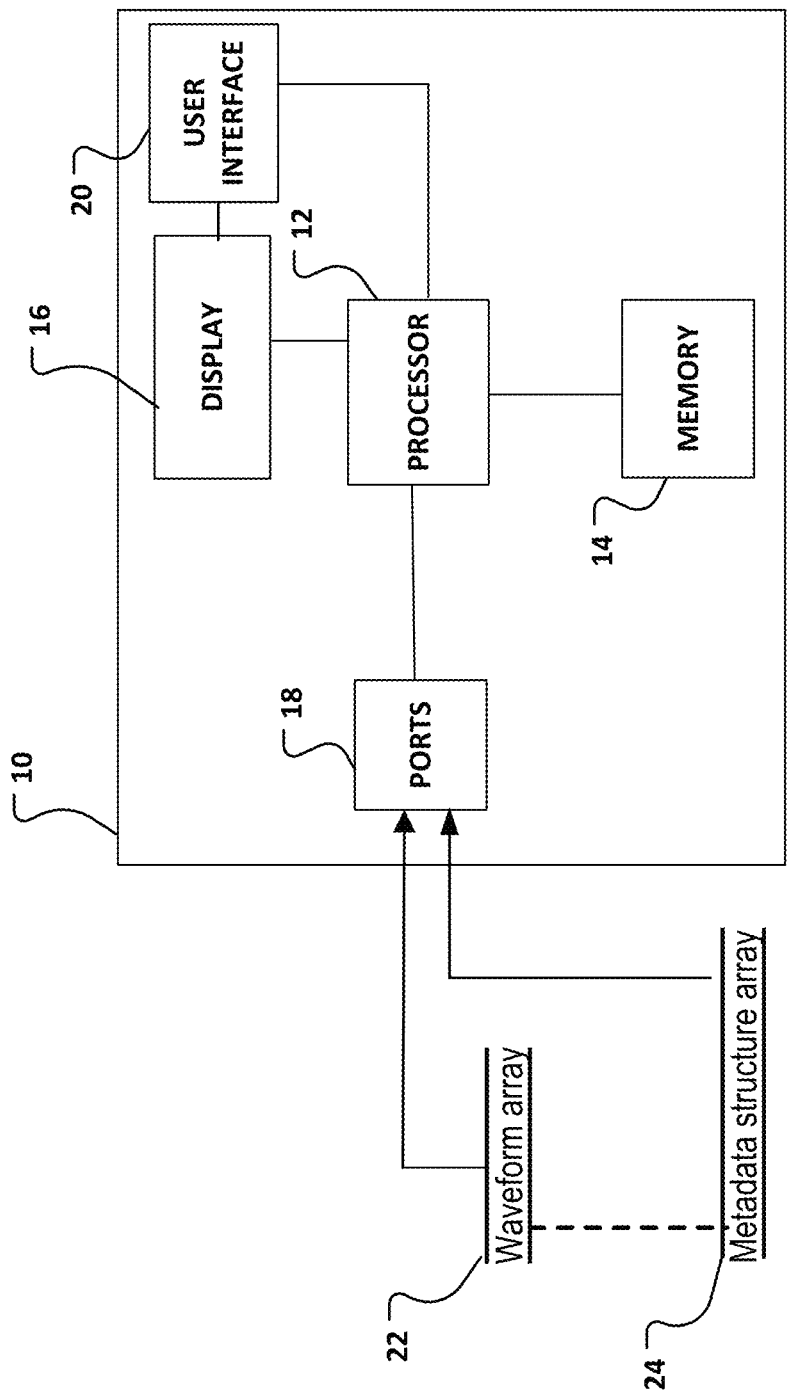
FIG. 1 shows a swept parameter test and measurement device.

One should note that the above discussion refers to this as an oscilloscope, but the embodiments here may include any type of test and measurement instrument that has the characteristics of being able to handle waveform data and to play the resulting "movies" or video sequences on a display. FIG. 1 shows an embodiment of a test and measurement instrument having this capability. The instrument 10, such as the SPO mentioned above, has one or more processors 12, a user interface 20 through which a user can provide inputs to the instrument, a display 16 that may display menus from which the user can make selections as well as playing the video sequences or "movie" of the waveforms. A memory 14 stores executable code that will cause the processor to perform the methods described below. The memory 14 may comprise several memories, including an acquisition memory for the instrument if it acquires the waveforms directly through the ports 18, and may also store the waveform array 22, the metadata array 24, the image array, and the movies/video sequences generated by the instrument. The ports 18 allows the instrument to connect to a device under test to acquire the waveform array and metadata array directly from a DUT.

One should note that the instrument may also receive the waveform array and metadata array from a memory location, from memory 14, or an external memory or device. A waveform array and metadata array may also result from simulating waveforms from a signal generator application.

Figure 2:
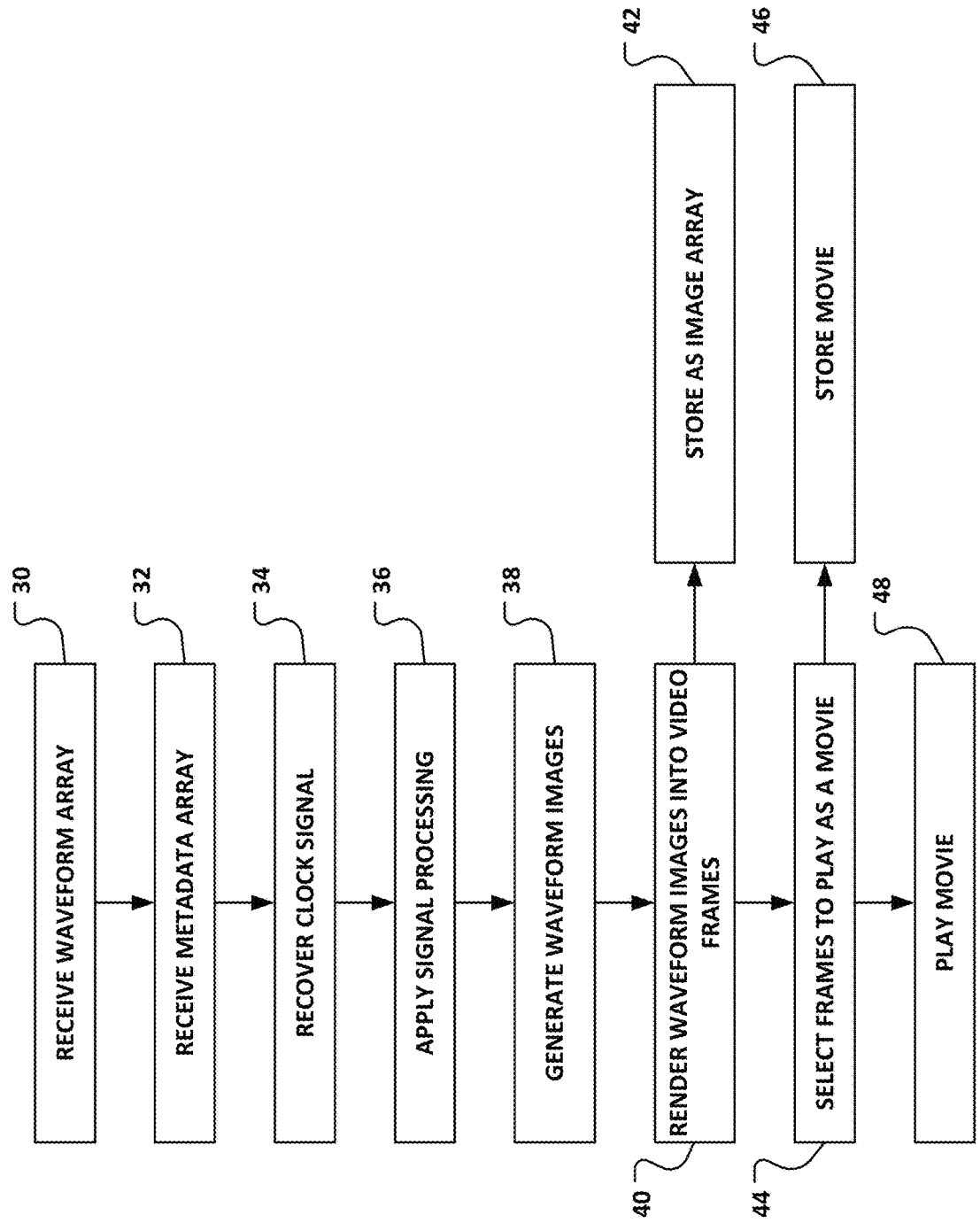
FIG. 2 shows a flowchart of a method of providing video streams of waveform data.

FIG. 2 shows a flowchart of an embodiment of operating a swept parameter instrument. The various aspects and processes discussed here may result from the one or more processors executing code to cause the one or more processors to perform the tasks. At 30, the instrument receives the waveform array in one of the ways mentioned above. At 32, the instrument receives the metadata array. The discussion here refers to the two bodies of data as arrays because a waveform and the corresponding metadata for that waveform have a same index in the arrays. The metadata array contains the values of the swept parameter associated with each waveform. It may also contain other data such as temperature and humidity, time stamp, etc. The user may provide inputs as to what, if any, metadata the waveform images should include. The waveform image generation will then include the metadata for that waveform in the image.

In order to create the waveform images to render into video frames, the instrument requires a clock signal. The process recovers the clock signal from the waveform data at 34. The clock will allow the instrument to build the eye diagram, or cyclic loop, waveform unit interval (UI) sequence image tensors, among others. The instrument may provide the user with a selection on the user interface to designate the type of image desired, or could have a fixed image type.

The instrument may apply various signal processing techniques to the waveform data prior to generating the waveform images at 36. These may include equalization including decision feedback equalizers (DFE), Fast Fourier Transforms (FFT), filters including Bessel Thomsom (BT) filters, etc. The instrument then generates the waveform image for each waveform of the selected or predetermined type, and including any metadata at 38.

The instrument then renders each waveform image into a video frame at 40, where each waveform is in one frame of the movie, or video sequence. The instrument stores the video frames of the movie as an image array at 42. This allows the instrument to gather different video frames into different video sequences to play as a movie. The selection of at least some of the video frames occurs at 44. In the embodiments below, the selection will include all the video frames, meaning all the waveforms, into a "full-length" movie or video sequence for the user to watch. However, the user may select one of the metadata parameters and the system would collect all the frames for the sweeping of that metadata parameter into a shorter video sequence. The resulting video sequences whether full-length movies or shorts, would also be stored at 46. At 48, the instrument plays the movie.

One should note that in this embodiment, the instrument makes the selection of the data to be included in the video sequence based on the video frames. In other embodiments, the selection may occur at the generation of the waveform images and selecting at least some of the waveform images to be rendered. While this seems much less efficient, as the waveform images would have to be rendered into video frames each time a sequence was selected, it would be a possible option and is considered to be in the scope of the claims. No ordering of the relevant processes in the flowchart of FIG. 2 is intended nor should it be implied.

Figure 3:
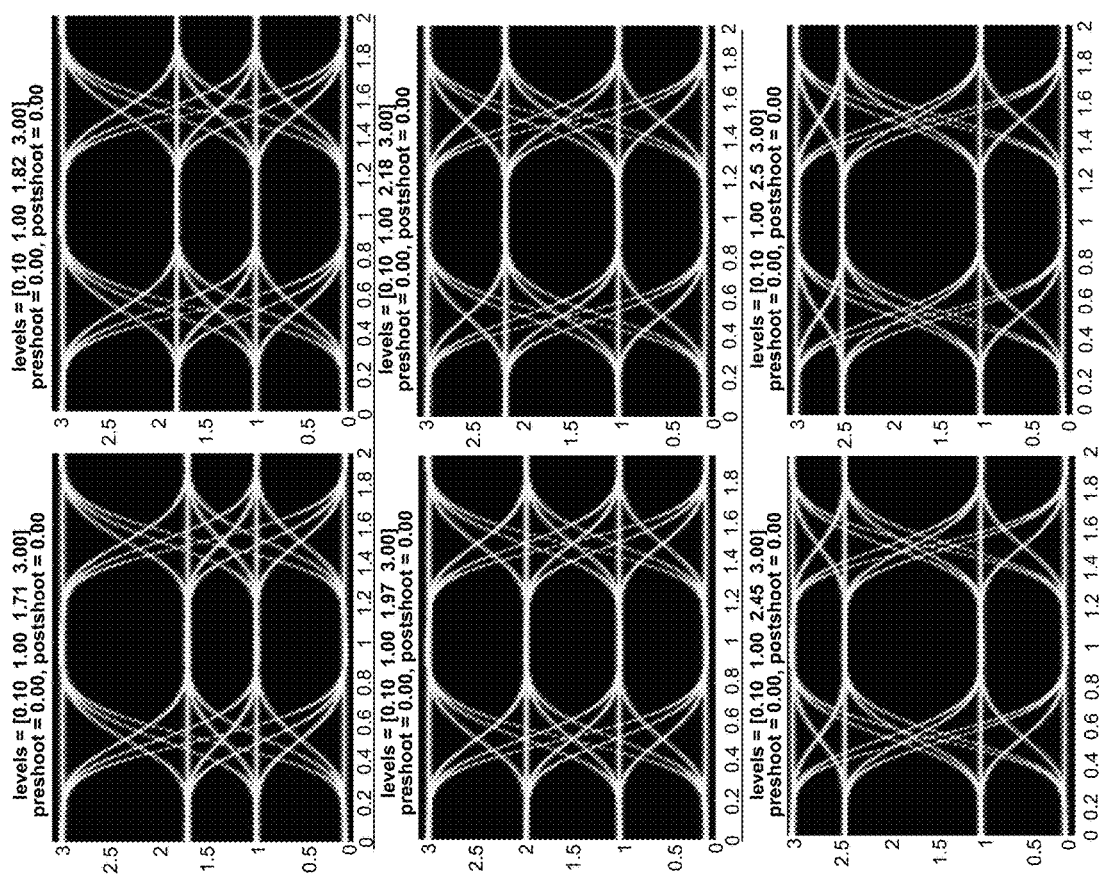
FIG. 3 shows examples of video frames of eye diagrams usable in a video stream of one swept parameter.

FIG. 3 shows six frames of a video sequence of waveform images. This example shows eye diagrams from sweeping the level 3 parameter for PAM-4 signaling while the other parameters (level 1, level 2, level 4, preshoot, postshoot) remain constant. As can one can see in the metadata display above each frame, the video frame sequence would go from left to right, top to bottom. The video sequence would animate the sweep from 1.71, to 1.82, to 1.97, to 2.18, to 2.45 to 2.5, giving the user a visualization of the changes to the signal based upon that sweep.

Figure 4:
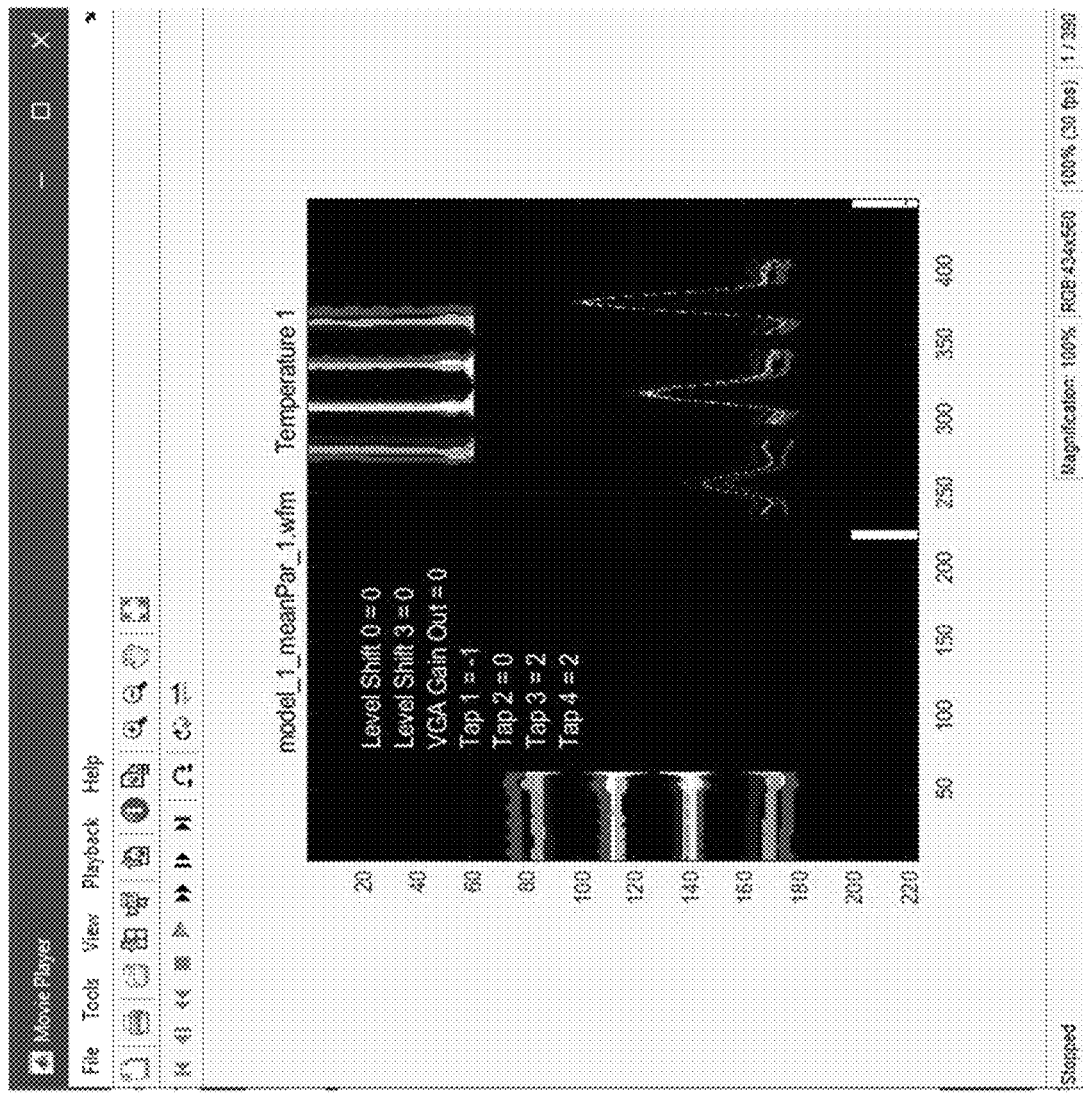
FIG. 4 shows an example of a video frame for a tensor image with metadata.

FIG. 4 shows a video frame of a short pattern waveform image as the first frame of a video sequence in a playback window displayed on the user interface. The displayed images result from some sort of transform applied to the waveform to generate the image. FIG. 3 shows the results of a transformation that creates eye diagrams, and FIG. 4 shows the results of a transformation resulting in a short pattern waveform image. Both images include the metadata.

Figure 6:
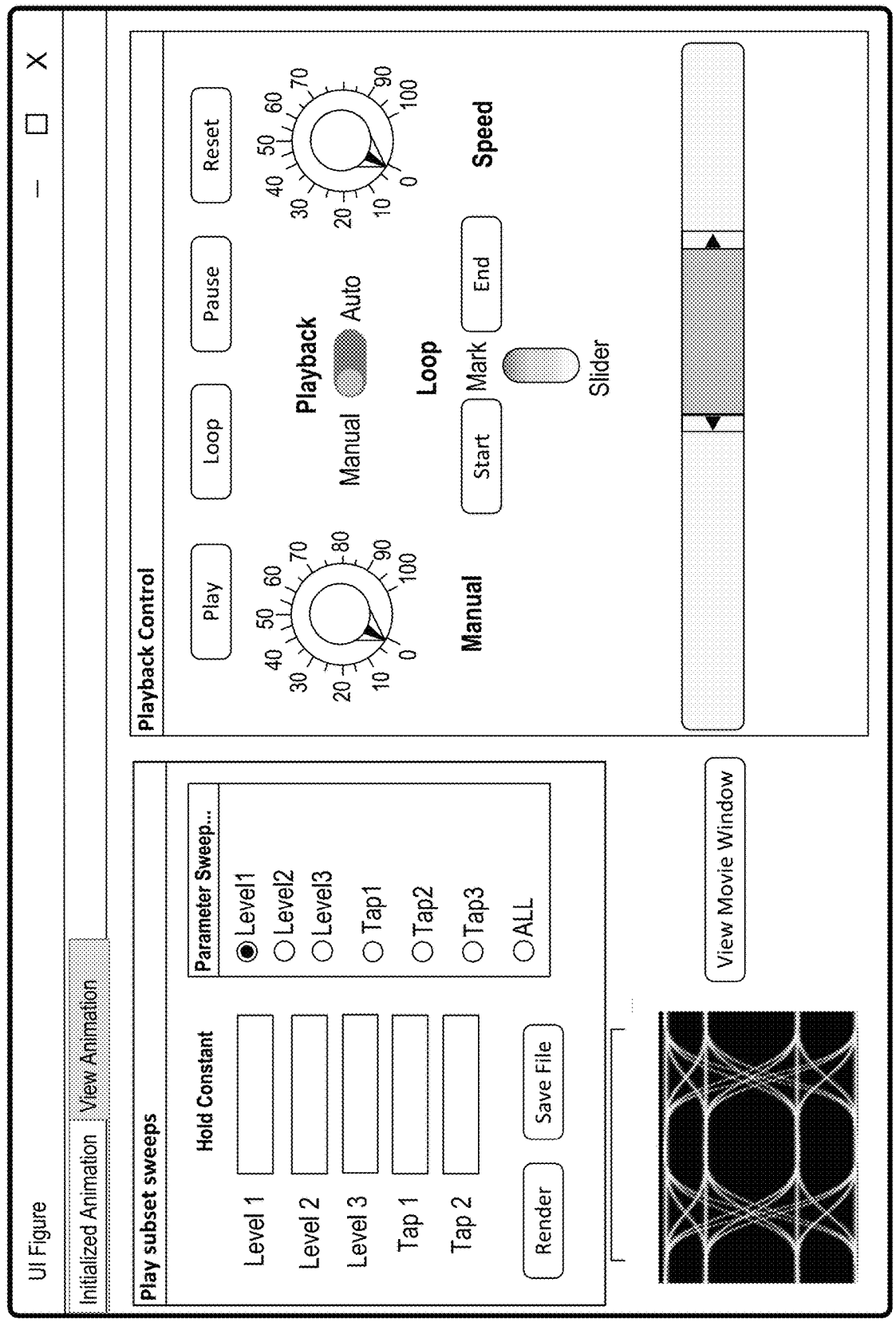
FIG. 6 shows an embodiment of a user interface.

As mentioned above, the instrument will provide menus to the user on the user interface. FIG. 5 and FIG. 6 show embodiments of these menus. FIG. 5 shows an initialization menu. The left side of the menu allows the user to enter the metadata array file, the waveform array file, and a text file providing the metadata labels and the possible values. The user can also provide the name for the output file. The user then lists the parameters to sweep and their ranges. The middle portion of the menu allows the user to determine what kind of waveform image(s) to create, i.e. what type(s) of transform(s) to apply to the waveform data to generate waveform image(s). When the user clicks on the Render All button, the system creates the movie. In the embodiments below, the selection resides on the View Animation menu, but could be moved to the initialization page.

FIG. 6 shows an embodiment of a user interface with a menu setup that allows the user control the playback and viewing of the movie. This menu may include the submenu that allows the user to create a movie short. The user then chooses one parameter to sweep, and enters in the fixed values for the other parameters during the sweep. Other options may include controls to play the movie and a specified playback speed, starting, stopping, and pausing functions. It also allows for loop points to be set where the movie will continuously loop play between the start and stop points determined by the user through the menu. There would also be a manual play back mode where the user turns a transport wheel, or other control, to scroll through the movie to the positions determined by the wheel.

For playback, the interface may include a speed control knob. It may also include a switch that allows play back to be automatic at the playback speed. Flipping the switch will change to manual mode, where a transport knob will cause the movie to play as the knob is turned. This allows the user to dial the movie to any frame number and leave it set and observe the frame.

By setting the loop switch to Mark, the user may dial to a movie position with the manual knob and press the Start button to mark the beginning of the playback loop. Then dial to another position and press the end button to mark the end of the playback loop. Alternatively, the loop switch comprise a Slider, then the user may use the slider bar tool to adjust the position and the length of the playback loop. The user may view in the small frame in the menu as shown, or pressing the View Movie Window button would open up a separate window for viewing.

This embodiments here describe a novel concept of an SPO, swept parameter oscilloscope or instrument. It allows a user to efficiently and conveniently view thousands of waveforms obtained by sweeping parameters. It allows the user to easily correlate their swept parameter values with the resulting waveform effects.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

EXAMPLES

Illustrative examples of the disclosed technologies are provided below. An embodiment of the technologies may include one or more, and any combination of, the examples described below.

Example 1 is a test and measurement instrument, comprising: a user interface configured to allow a user to provide one or more user inputs; a display to display results to the user; a memory; and one or more processors configured to execute code to cause the one or more processors to: receive a waveform array containing waveforms resulting from sweeping one or more parameters from a set of parameters; recover a clock signal from the waveform array; generate a waveform image for each waveform; render the waveform images into video frames to produce an image array of the video frames; select at least some of the video frames to form a video sequence; and play the video sequence on a display.

Example 2 is the test and measurement instrument of Example 1, wherein the one or more processors are further configured to execute code to receive metadata corresponding to each waveform in a metadata array.

Example 3 is the test and measurement instrument of either of Examples 1 or 2, wherein the one or more user inputs includes a user input identifying metadata to be included in each waveform image, and the code to cause the one or more processors to generate the waveform image for each waveform further comprises code to cause the one or more processors to include the metadata for the waveform in the waveform image.

Example 4 is the test and measurement instrument of any of Examples 1 through 3, wherein the one or more processors are further configured to execute code to apply signal processing to the waveforms prior to generating the waveform images.

Example 5 is the test and measurement instrument of any of Examples 1 and 4, wherein the one or more processors are further configured to execute code to store at least one of the image array and the video sequence.

Example 6 is the test and measurement instrument of any of Examples 1 through 5, wherein the code to cause the one or more processors to select at least some of the video frames comprises code to cause the one or more processors to select all the video frames.

Example 7 is the test and measurement instrument of any of Examples 1 through 6, wherein the code to cause the one or more processors to select at least some of the video frames comprises code to cause the one or more processors to select only video frames related to a selected parameter identified by the one or more user inputs.

Example 8 is the test and measurement instrument of any of Examples 1 through 7, wherein the code to cause the one or more processors to generate each waveform into a waveform image comprises code to cause the one or more processors to generate each waveform image as a type of an image identified from a user input.

Example 9 is the test and measurement instrument of any of Examples 1 through 8, wherein the one or more processors are further configured to execute code to cause the one or more processors to store one or more of the image array, the video sequence, and the waveform images.

Example 10 is the test and measurement instrument of any of Examples 1 through 9, wherein the one or more processors are further configured to execute code to cause the one or more processors to provide user controls on the user interface that allow the user to control the playing of the video sequence.

Example 11 is a method of animating waveform data, comprising: receiving a waveform array containing waveforms resulting from sweeping one or more parameters from a set of parameters; recovering a clock signal from the waveforms; generating a waveform image from each of the waveforms; rendering the waveform images into video frames to produce an image array of the video frames;

selecting at least some of the video frames to play as a video sequence; and playing the video sequence on a display.

Example 12 is the method of Example 11, further comprising receiving metadata for each waveform in the waveform array as an array of metadata.

Example 13 is the method of either of Examples 11 and 12, further comprising receiving a user input selecting metadata to be included in the waveform images, and generating the waveform image for each waveform comprises including the metadata corresponding to the waveform in the waveform image.

Example 14 is the method of any of Examples 11 through 13, further comprising receiving a user input selecting a type of waveform image, and rendering each waveform into the video frames comprises rendering each waveform as a waveform image of the type.

Example 15 is the method of any of Examples 11 through 14, further comprising applying signal processing to the waveforms in the waveform array before generating the waveform images.

Example 16 is the method of any of Examples 11 through 15, further comprising storing at least one of the image array and the video sequence.

Example 17 is the method of any of Examples 11 through 16, wherein selecting at least some of the video frames comprises selecting one of: all video frames in the image array, and only video frames related to a particular parameter identified by a user input.

Example 18 is the method of any of Examples 11 through 17, further comprising providing a user interface having user controls to allow the user to control the playing of the video sequence, wherein the user controls allow the user to perform one or more of: starting the video sequence, stopping the video sequence, setting loop positions in the video sequence, playing the video sequence automatically, and playing the video sequence manually.

Example 19 is the method of any of Examples 11 through 18, wherein playing the video sequence comprises playing the video sequence on the user interface that includes user controls, or playing the video sequence in a separate window.

Example 20 is the method of any of Examples 11 through 18, wherein receiving the waveform array comprises receiving the waveform array from one or more devices under test, or from a memory.

Although specific aspects of the disclosure have been illustrated and described for purposes of illustration, it will be understood that various modifications may be made without departing from the spirit and scope of the disclosure. Accordingly, the disclosure should not be limited except as by the appended claims.

We claim:

1. A test and measurement instrument, comprising:
   a user interface configured to allow a user to provide one or more user inputs;
   a display to display results to the user;
   a memory; and
   one or more processors configured to execute code to cause the one or more processors to:
   receive a waveform array containing waveforms resulting from sweeping one or more parameters from a set of parameters;
   recover a clock signal from the waveform array;
   generate a waveform image for each waveform;
   render the waveform images into video frames to produce an image array of the video frames;
   select at least some of the video frames to form a video sequence; and
   play the video sequence on a display.

2. The test and measurement instrument as claimed in claim 1, wherein the one or more processors are further configured to execute code to receive metadata corresponding to each waveform in a metadata array.

3. The test and measurement instrument as claimed in claim 1, wherein the one or more user inputs includes a user input identifying metadata to be included in each waveform image, and the code to cause the one or more processors to generate the waveform image for each waveform further comprises code to cause the one or more processors to include the metadata for the waveform in the waveform image.

4. The test and measurement instrument as claimed in claim 1, wherein the one or more processors are further configured to execute code to apply signal processing to the waveforms prior to generating the waveform images.

5. The test and measurement instrument as claimed in claim 1, wherein the one or more processors are further configured to execute code to store at least one of the image array and the video sequence.

6. The test and measurement instrument as claimed in claim 1, wherein the code to cause the one or more processors to select at least some of the video frames comprises code to cause the one or more processors to select all the video frames.

7. The test and measurement instrument as claimed in claim 1, wherein the code to cause the one or more processors to select at least some of the video frames comprises code to cause the one or more processors to select only video frames related to a selected parameter identified by the one or more user inputs.

8. The test and measurement instrument as claimed in claim 1, wherein the code to cause the one or more processors to generate each waveform into a waveform image comprises code to cause the one or more processors to generate each waveform image as a type of an image identified from a user input.

9. The test and measurement instrument as claimed in claim 1, wherein the one or more processors are further configured to execute code to cause the one or more processors to store one or more of the image array, the video sequence, and the waveform images.

10. The test and measurement instrument as claimed in claim 1, wherein the one or more processors are further configured to execute code to cause the one or more processors to provide user controls on the user interface that allow the user to control the playing of the video sequence.

11. A method of animating waveform data, comprising:
    receiving a waveform array containing waveforms resulting from sweeping one or more parameters from a set of parameters;
    recovering a clock signal from the waveforms;
    generating a waveform image from each of the waveforms;
    rendering the waveform images into video frames to produce an image array of the video frames;
    selecting at least some of the video frames to play as a video sequence; and
    playing the video sequence on a display.

12. The method as claimed in claim 11, further comprising receiving metadata for each waveform in the waveform array as an array of metadata.

13. The method as claimed in claim 11, further comprising receiving a user input selecting metadata to be included in the waveform images, and generating the waveform image for each waveform comprises including the metadata corresponding to the waveform in the waveform image.

14. The method as claimed in claim 11, further comprising receiving a user input selecting a type of waveform image, and rendering each waveform into the video frames comprises rendering each waveform as a waveform image of the type.

15. The method as claimed in claim 11, further comprising applying signal processing to the waveforms in the waveform array before generating the waveform images.

16. The method as claimed in claim 11, further comprising storing at least one of the image array and the video sequence.

17. The method as claimed in claim 11, wherein selecting at least some of the video frames comprises selecting one of: all video frames in the image array, and only video frames related to a particular parameter identified by a user input.

18. The method as claimed in claim 11, further comprising providing a user interface having user controls to allow the user to control the playing of the video sequence, wherein the user controls allow the user to perform one or more of: starting the video sequence, stopping the video sequence, setting loop positions in the video sequence, playing the video sequence automatically, and playing the video sequence manually.

19. The method as claimed in claim 11, wherein playing the video sequence comprises playing the video sequence on the user interface that includes user controls, or playing the video sequence in a separate window.

20. The method as claimed in claim 11, wherein receiving the waveform array comprises receiving the waveform array from one or more devices under test, or from a memory.

* * * * *